(12) United States Patent
Paak et al.

(10) Patent No.: US 7,688,639 B1
(45) Date of Patent: Mar. 30, 2010

(54) CMOS-COMPATIBLE NON-VOLATILE MEMORY CELL WITH LATERAL INTER-POLY PROGRAMMING LAYER

(75) Inventors: Sunhom Paak, San Jose, CA (US); Boon Yong Ang, Santa Clara, CA (US); Hsung Jai Im, Cupertino, CA (US); Daniel Gitlin, Palo Alto, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/974,361

(22) Filed: Oct. 12, 2007

Related U.S. Application Data

(62) Division of application No. 11/240,030, filed on Sep. 30, 2005, now Pat. No. 7,294,888.

(51) Int. Cl.
*G11C 16/06* (2006.01)
(52) U.S. Cl. .................................. 365/185.22
(58) Field of Classification Search ............. 365/185.22
See application file for complete search history.

(56) References Cited

U.S. PATENT DOCUMENTS

| | | | |
|---|---|---|---|
| 6,413,818 B1 | 7/2002 | Huang et al. | |
| 7,067,875 B2 | 6/2006 | Shukuri | |
| 7,154,779 B2 | 12/2006 | Mokhlesi et al. | |
| 7,294,888 B1 | 11/2007 | Paak et al. | |
| 2002/0196665 A1* | 12/2002 | Kim | 365/185.22 |
| 2004/0079988 A1* | 4/2004 | Harari | 257/316 |
| 2004/0120175 A1* | 6/2004 | Schrom et al. | 365/51 |

OTHER PUBLICATIONS

U.S. Appl. No. 11/240,030, filed Sep. 30, 2005, Paak, Sunhom et al., "CMOS-Compatible Non-Volatile Memory Cell with Lateral Inter-Poly Programming Layer", 21 pages, available from Xilinx Inc., 2100 Logic Drive, San Jose, CA 95124.

* cited by examiner

*Primary Examiner*—Hoai V Ho
*Assistant Examiner*—Jason Lappas
(74) *Attorney, Agent, or Firm*—Scott Hewett; LeRoy D. Maunu; Lois D. Cartier

(57) ABSTRACT

An electrically erasable programmable read-only memory ("CMOS NON-VOLATILE MEMORY") cell is fabricated using standard CMOS fabrication processes. First and second polysilicon gates are patterned over an active area of the cell between source and drain regions. Thermal oxide is grown on the polysilicon gates to provide an isolating layer. Silicon nitride is deposited between the first and second polysilicon gates to form a lateral programming layer.

9 Claims, 5 Drawing Sheets

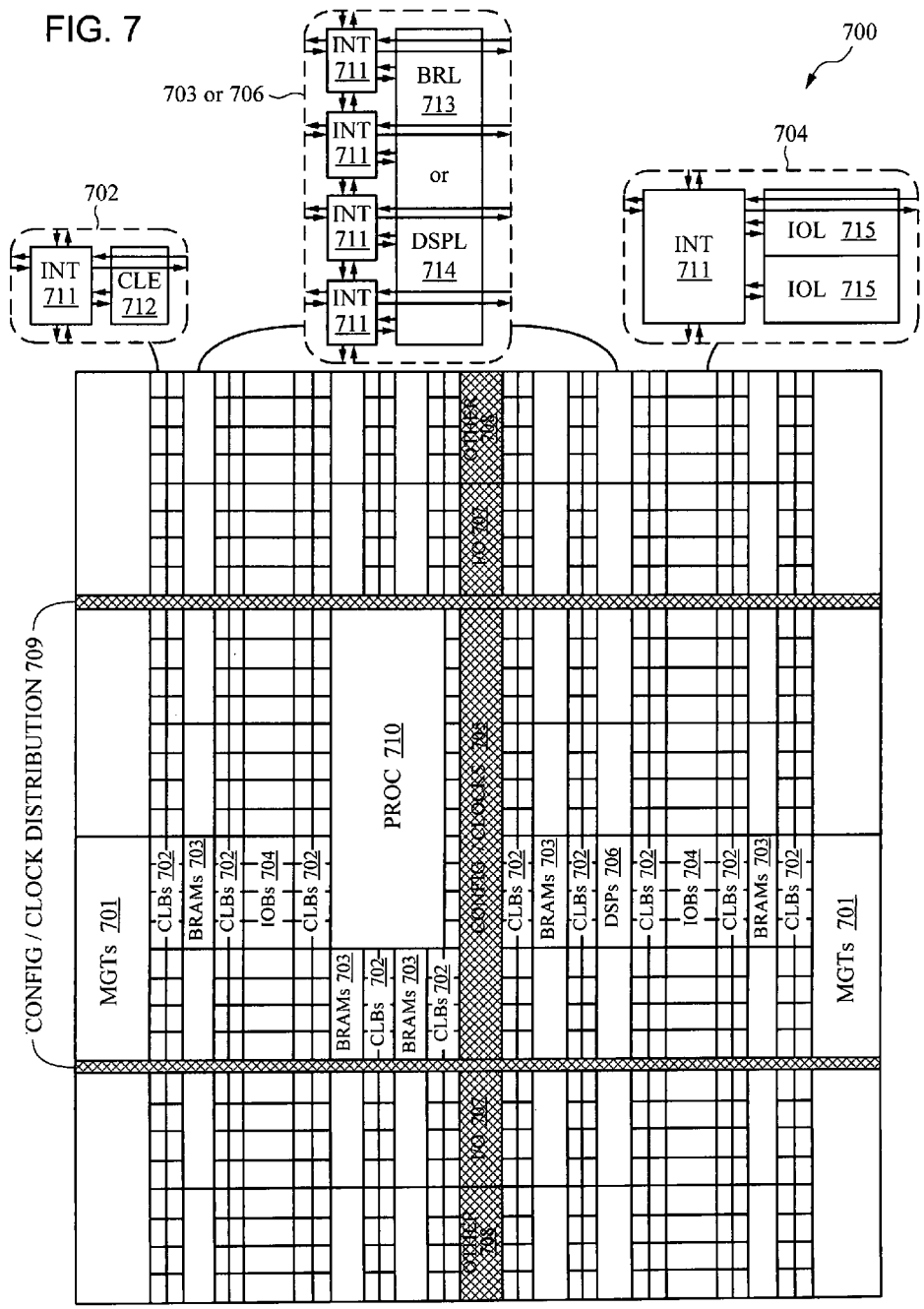

US 7,688,639 B1

CMOS-COMPATIBLE NON-VOLATILE MEMORY CELL WITH LATERAL INTER-POLY PROGRAMMING LAYER

FIELD OF THE INVENTION

This invention relates generally to integrated circuits, and more particularly to electronically erasable, programmable read-only memory.

BACKGROUND OF THE INVENTION

Various types of memory are used with digital integrated circuits ("ICs"). Volatile memory is a type of memory that loses its stored information when power is removed from the memory circuit. Random access memory ("RAM") is an example of volatile memory. A RAM cell can be easily reprogrammed to a desired logic state, and is often implemented in complementary metal-oxide-semiconductor (CMOS) logic. Non-volatile memory is a type of memory that preserves its stored information even if power is removed. Read-only memory ("ROM") is an example of non-volatile memory.

Programmable read-only memory ("PROM") is a type of memory that is configured to a desired state. A programming signal is applied to a PROM memory cell to change the cell from a first condition (i.e. first logic state) to a second condition (i.e. a second logic state). Programmable non-volatile memory is desirable in programmable logic devices ("PLDs"), such as field-programmable gate arrays ("FPGAs") and complex programmable logic devices ("CPLDs"). Some types of programmable non-volatile memory, such as anti-fuse based memory, can only be programmed once. Another type of programmable non-volatile memory can be electronically programmed and erased several times. Examples of this type of non-volatile memory are commonly referred to as electronically erasable programmable read-only memory ("CMOS NON-VOLATILE MEMORY") or "flash" memory.

Conventional flash memory cells use multiple poly-silicon ("poly") deposition and patterning steps, and typically have overlapping poly structures. Such flash memory is expensive to incorporate in a CMOS IC because of the additional process steps, particularly the additional poly deposition steps. A typical CMOS fabrication sequence includes only a single polysilicon deposition. It is desirable to provide a CMOS non-volatile memory cell fabricated using standard CMOS techniques.

SUMMARY OF THE INVENTION

In an exemplary embodiment of the invention a non-volatile memory cell is fabricated using standard CMOS fabrication processes. First and second polysilicon gates are patterned over an active area of the cell between source and drain regions. Thermal oxide is grown on the polysilicon gates to provide isolating layers. Silicon nitride is deposited to form sidewall spacers on the sides of the polysilicon gates, and to form a lateral programming layer between the polysilicon gates. Thus, a lateral silicon-oxide-nitride-oxide-silicon programming structure is provided.

BRIEF DESCRIPTION OF THE DRAWINGS

FIG. 7 is a plan view of an FPGA with CMOS non-volatile memory according to an embodiment of the invention.

DETAILED DESCRIPTION OF THE DRAWINGS

Figure 1A:
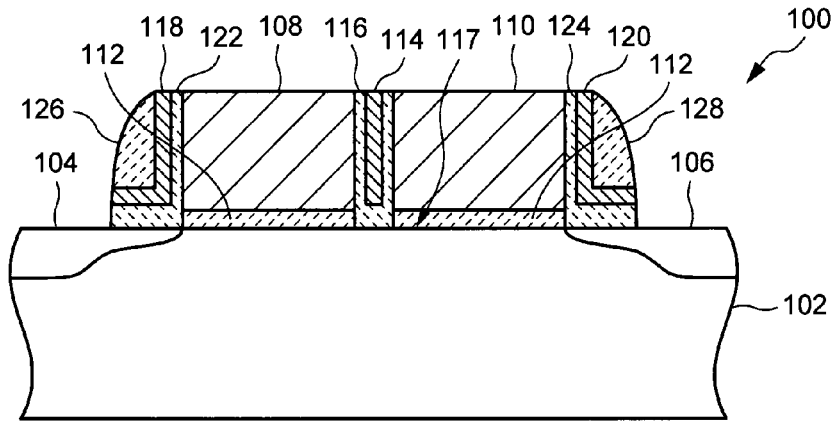
FIG. 1A is a cross section of a CMOS non-volatile memory cell according to an embodiment of the invention.

FIG. 1A is a cross section of a CMOS non-volatile memory cell 100 according to an embodiment of the invention. The CMOS non-volatile memory cell 100 is fabricated on a substrate 102 that is common to other CMOS non-volatile memory cells, and in a particular embodiment is common to CMOS circuitry. The substrate is a silicon wafer, silicon-on-insulator wafer, or other wafer that provides a silicon fabrication surface. In a specific embodiment, a PLD, such as an FPGA (see FIG. 7), is fabricated on the substrate 102, and the CMOS non-volatile memory cell is incorporated in the PLD. FIG. 1A is not drawn to scale. The relative thicknesses of layers and other dimensions are exaggerated to illustrate the structure of the memory cell.

The CMOS non-volatile memory cell 100 has a source region 104, a drain region 106, a first poly gate 108, and a second poly gate 110, which are formed from polysilicon. The first and second poly gates 108, 110 are separated from the substrate 102 by gate dielectric 112, which in a particular embodiment is oxide-nitride-oxide ("ONO") dielectric material. A silicon nitride ("SiN") lateral programming layer 114 between the first and second poly gates 108, 110 is isolated from the first and second poly gates 108, 110 by an isolating layer 116. In a particular embodiment, the isolating layer 116 is thermally grown silicon oxide, which is grown from the poly gates 108, 110 and substrate 102. Alternatively, the isolating layer is a layer of deposited dielectric material. In a yet alternative embodiment, the gates are other than poly gates, and the isolating layer is deposited.

The lateral programming layer extends vertically from a major surface 117 of the substrate 102, and provides a charge storage element similar to the silicon-oxide-nitride-oxide-silicon ("SONOS")-type flash memory cells. However, the SONOS-type memory cells have a charge storage structures that lie generally in the plane of the substrate. The lateral programming layer runs between (i.e. lateral to) the poly gates in a plane perpendicular to the major surface of the substrate. The poly gates are used to program the lateral programming layer (see FIGS. 2A, 3).

The thickness of the isolating layer 116 is important. A layer that is too thin will result in charge loss from the lateral programming layer 114. A layer that is too thick will be result in a memory cell that is difficult to program and erase. In a particular embodiment, the isolating layer 116 is about 50 Angstroms to about 300 Angstroms thick silicon dioxide.

The programming layer 114 is deposited concurrently with SiN sidewall spacers 118, 120, which are part of the normal CMOS fabrication sequence. SiN sidewall spacers have charge traps and are desirable for controlling e-field fringing in the channel near the source 104 and drain 106. Sidewall isolating layers 122, 124, which in a particular embodiment are thermal oxide grown concurrently with the isolating layer 116, are provided to separate the SiN from the poly gates and the silicon substrate 102. Second sidewall spacers 126, 128 are formed from deposited silicon oxide and align the source/drain implant.

Figure 1B:
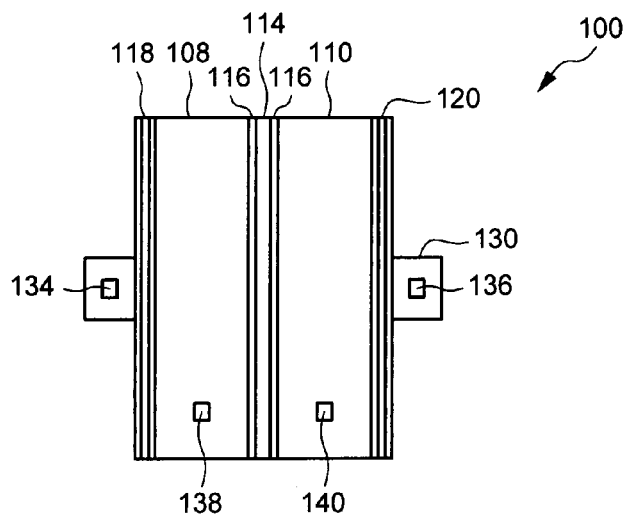
FIG. 1B is a plan view of the CMOS non-volatile memory cell of FIG. 1A.

FIG. 1B is a plan view of the CMOS non-volatile memory cell 100 of FIG. 1A. The first poly gate 108 and the second poly gate 110 are patterned over the active region 130 of the CMOS non-volatile memory cell 100. The active region is a well ("device well") of P-type material formed in the substrate, for an NMOS transistor. Alternatively, the active region is a well of N-type material; however, NMOS transistors are easier to program because electrons more easily tunnel through isolating layers. The poly gates are patterned concurrently, basically just like printing a conventional gate in the CMOS fabrication sequence except that the patterning mask provides a gap between the poly gates 108, 110. Thus, patterning the two poly gates does not require additional deposition, photomasking, or etch steps.

A source contact 134 provides an electrical path to the source, and a drain contact 136 provides an electrical path to the drain. Similarly, a first gate contact 138 provides an electrical path to the first poly gate 108, and a second gate contact 140 provides an electrical path to the second poly gate. The SiN lateral programming layer 114 is separated from the first and second poly gates 108, 110 by isolating layer 116, which wraps around the SiN lateral programming layer (see FIG. 1A).

The SiN lateral programming layer 114 and the isolating layer 116 are formed in the gap defined between the two poly gates 108, 110. The gap is not less than the minimum critical dimension of the poly gate definition process, and in a particular embodiment is about 5 nano-meters ("nm") to about 100 nm wide. The gap is wide enough so that, after thermally growing the isolating layer 116 (which is typically about 50-100 Angstroms thick on each side, thus reducing the gap by about 100-200 Angstroms), the remainder of the gap is filled with SiN during the SiN sidewall 118, 120 formation process, which in a particular embodiment is a plasma process.

Figure 2A:
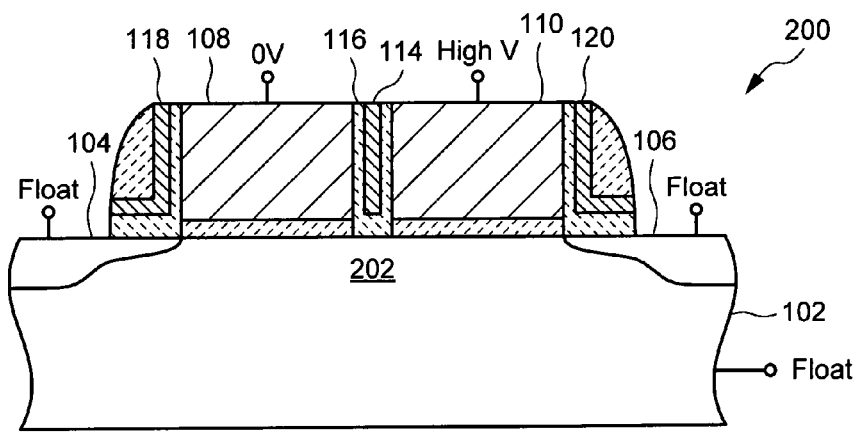
FIG. 2A is a cross section of a CMOS non-volatile memory cell according to an embodiment of the invention during a PROGRAM operation.

FIG. 2A is a cross section of a CMOS non-volatile memory cell 200 according to an embodiment of the invention during a PROGRAM operation. The substrate 102, source 104, and drain 106 are left floating while the first gate 108 is grounded. A high voltage is applied to the second gate 110. The high voltage is sufficient to attract electrons from the first gate 108 through the isolating layer 116 into the lateral programming layer 114 by any of several mechanisms commonly referred to as "tunneling." Some electrons may be attracted through the other side of the isolating layer 116 into the second poly gate 110; however, sufficient electrons remain in the SiN lateral programming layer to provide an accumulated negative charge when the high voltage programming signal is removed.

In particular embodiments, the SiN layer forming the lateral programming layer 114 and the sidewall spacers 118, 120 is deposited so as to provide enhanced trapping sites in the SiN. This in turn promotes charge storage in the lateral programming layer.

The negative charge on the lateral programming layer essentially provides a negative bias over the channel region 202. The channel region 202 beneath the lateral programming layer will locally accumulate positive charge, creating a higher threshold voltage $V_T$ than a comparable CMOS non-volatile memory cell that has not been programmed. Thus, the CMOS non-volatile memory cell can be read using a technique similar to a conventional CMOS READ operation.

Figure 2B:
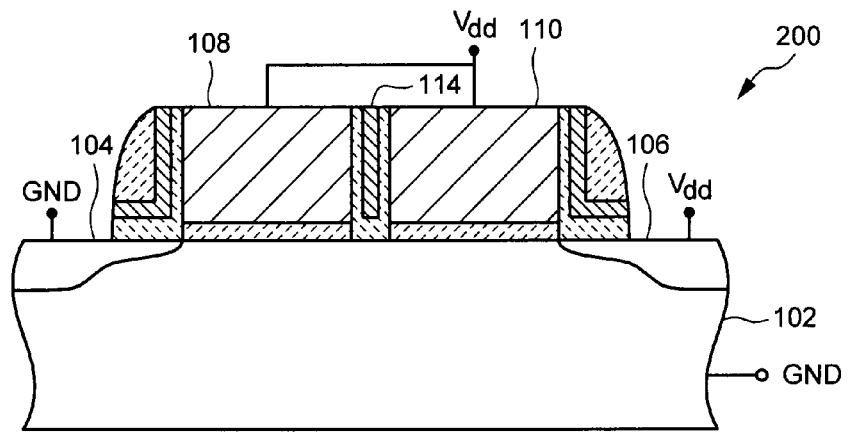
FIG. 2B is a cross section of the CMOS NON-VOLATILE MEMORY cell of FIG. 2A during a READ operation.

FIG. 2B is a cross section of the CMOS non-volatile memory cell 200 of FIG. 2A during a READ operation. The substrate 102 and source 104 are grounded, while a voltage $V_{DD}$ is applied to the poly gates 108, 110, and to the drain 106. $V_{DD}$ is less than the high voltage used to program the CMOS non-volatile memory cell 200, typically between about 1 V and about 5 V, and reading the CMOS non-volatile memory cell does not remove sufficient charge from the lateral programming layer 114 to alter the logic state of the CMOS non-volatile memory cell.

In a typical N-type MOSFET, such as are used in CMOS ICs, applying a positive voltage (e.g. $V_{DD}$) to the gate repels holes from the channel region into the substrate, thereby changing the channel from depletion mode to inversion mode and decreasing channel resistance. In a programmed CMOS non-volatile memory cell, the negative charge accumulated on the lateral programming layer does just the opposite. The negatively charged lateral programming layer attracts holes in the channel region so that the device operates more in accumulation mode, thus increasing channel resistance. The logic state of the CMOS non-volatile memory cell 200 is determined by sensing the resistance of the device, similar to how a MOSFET-based RAM memory cell is sensed. Thus, the CMOS non-volatile memory cell 200 is not only fabricated in a manner consistent with CMOS IC techniques, it is also read in a manner consistent with CMOS IC RAM cells.

Figure 2C:
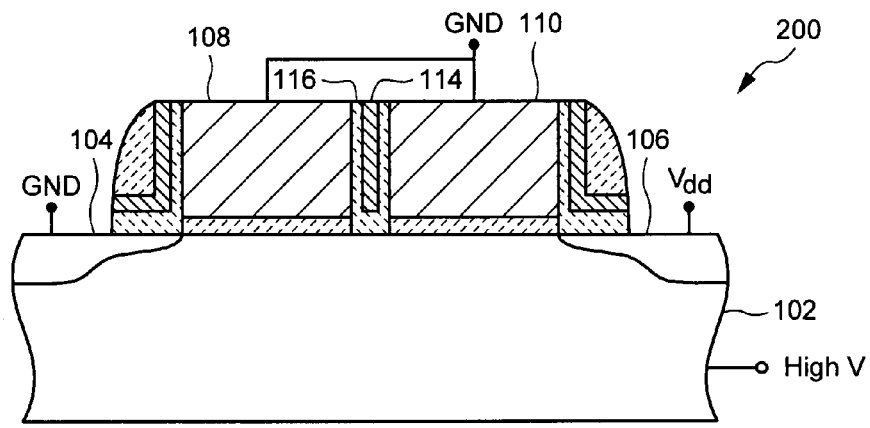
FIG. 2C is a cross section of the CMOS non-volatile memory cell of FIG. 2A during an ERASE operation.

FIG. 2C is a cross section of the CMOS non-volatile memory cell 200 of FIG. 2A during an ERASE operation. The drain 104, source 106, and poly gates 108, 110 are grounded, and a high voltage is applied to the substrate 102. The high voltage is sufficiently high to remove charge from the lateral programming layer 114 by attracting electrons to tunnel through the isolating layer 116 and/or gate oxide into the substrate. Thus, erasing the CMOS non-volatile memory cell 200 is accomplished with a simple, two-dimensional electric field.

Erasing the CMOS non-volatile memory cell 200 returns the cell to a low $V_T$ state. After an ERASE operation, the channel beneath the lateral programming layer 114 well be inverted during a READ operation (see FIG. 2B), and the CMOS NON-VOLATILE MEMORY cell 200 will operate essentially the same as an un-programmed CMOS NON-VOLATILE MEMORY cell during a READ operation.

Figure 3:
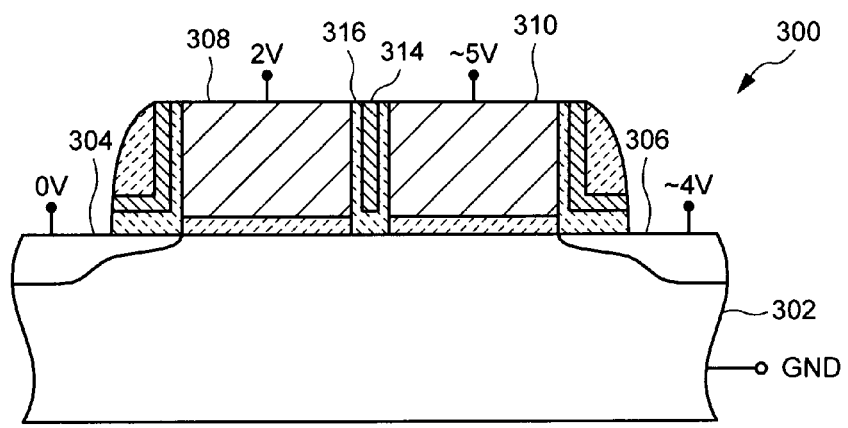
FIG. 3 is a cross section of a CMOS non-volatile memory cell according to another embodiment of the invention during a channel hot electron PROGRAM operation.

FIG. 3 is a cross section of a CMOS NON-VOLATILE MEMORY cell 300 according to another embodiment of the invention during a channel hot electron ("CHE") PROGRAM operation. The substrate 302 is grounded, zero volts is applied to the source 304, a high voltage, which in a particular embodiment is about four volts, is applied to the drain 306, and a lower voltage, which in a particular embodiment is about two volts, is applied to the first poly gate 308, and about five volts is applied to the second poly gate 310. This creates a condition where energetic electrons are flowing through the channel from the source 304 to the drain 306. The relatively high voltage of the second poly gate 310 attracts electrons, some of which scatter through the isolating layer 316 to become trapped in the lateral programming layer 314. The electrons trapped in the lateral programming layer provide a negative bias, as described above in reference to FIG. 2A. Most of the hot electrons will be relatively closer to the drain 306, and the lateral programming layer 314 is closer to the drain 306 than to the source 304 to expose it to more hot electrons. An advantage of using CHE programming is that a lower voltage is used to program the CMOS non-volatile memory cell 300, compared to the CMOS non-volatile memory cell described in reference to FIG. 2A. In an alternative embodiment, CHE programming is used with a CMOS non-volatile memory cell substantially in accordance with the CMOS non-volatile memory cell illustrated in FIG. 1A.

Figure 4:
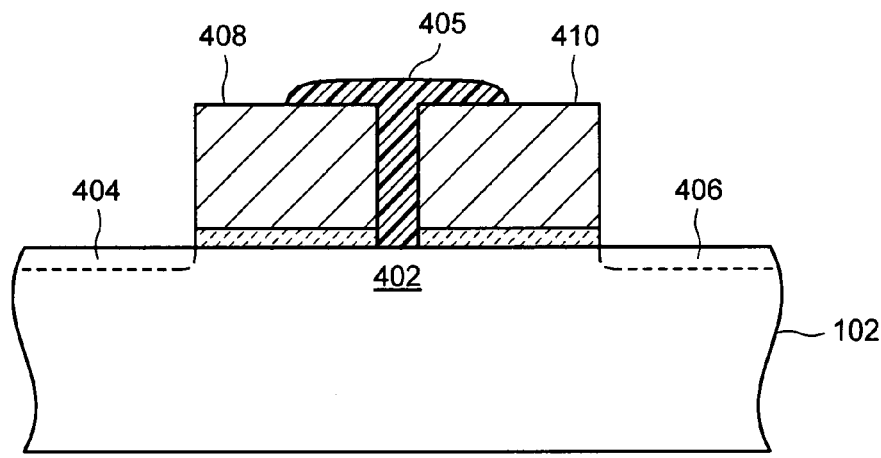
FIG. 4 is a cross section of a partially fabricated CMOS non-volatile memory cell according to an embodiment of the present invention.

FIG. 4 is a cross section of a partially fabricated CMOS non-volatile memory cell 400 according to an embodiment of the present invention. Some embodiments of the invention are able to be incorporated into a standard CMOS fabrication process. In a particular embodiment, no new processes need to be added to the CMOS fabrication process; however, an extra photoresist sequence (i.e. formation, patterning, and removal) is used to avoid doping the region 402 of the substrate 102 in the gap between the first and second poly gate structures 408, 410 during a lightly-doped drain ("LDD") implant. An LDD implant is a common process step in CMOS fabrication, and provides a lightly doped source region 404 and a lightly doped drain region 406, both of which are self-aligned to the first and second poly gate structures 408, 410. Photoresist 405 is deposited and patterned to fill the gap and block the LDD implant from the region 402, and is removed after the LDD implant. In a particular embodiment, the gate oxide removed to form the gap is at least partially re-formed when the isolating layer is formed (see FIG. 1A, ref. num. 116). Alternatively, the gate oxide is not removed at the bottom of the gap, and the oxide in this region thickens slightly when the isolating layer is formed on the sides of the gap (first and second silicon gates).

Figure 5:
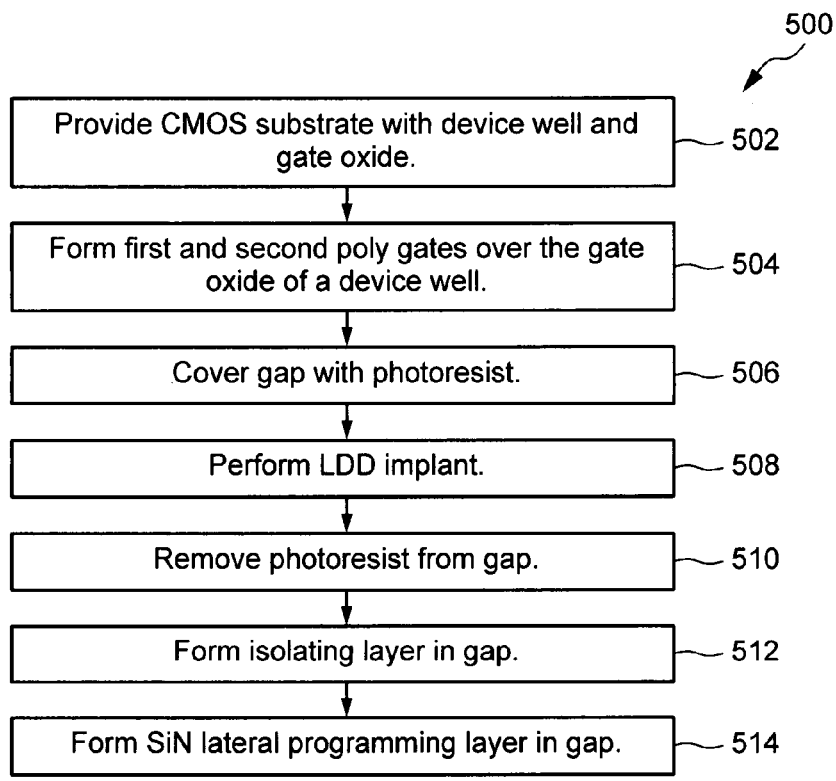
FIG. 5 is a flow chart of a method of fabricating a CMOS non-volatile memory cell according to an embodiment of the invention.

FIG. 5 is a flow chart of a method 500 of fabricating a CMOS non-volatile memory cell according to an embodiment of the invention. A CMOS substrate including gate oxide layer and a device well is provided (step 502). A first poly gate and a second poly gate are formed over the gate oxide layer of the device well so as to form a gap having a selected width between the first poly gate and the second poly gate (step 504). The gap is covered with photoresist (step 506), and an LDD implant is performed (step 508). The photoresist is removed (step 510), and an isolating layer is formed on the first poly gate, the second poly gate, and the surface of the device well in the gap (step 512). In a particular embodiment, the isolating layer is a thermally grown silicon dioxide layer, and additional isolating layers are formed on the sidewalls of the first and second poly gates next to source and drain regions.

A SiN layer is deposited so as to at least partially fill the remainder of the gap to form a lateral programming layer between the first poly gate and the second poly gate (step 514). In a particular embodiment, the SiN layer also forms sidewall spacers on the isolating layers on the sidewalls of the first and second poly gates. In a particular embodiment, the SiN deposition process is controlled so as to enhance the number of trapping sites in the SiN and promote charge accumulation. Conventional processing steps are used to complete fabrication of the CMOS substrate.

Figure 6:
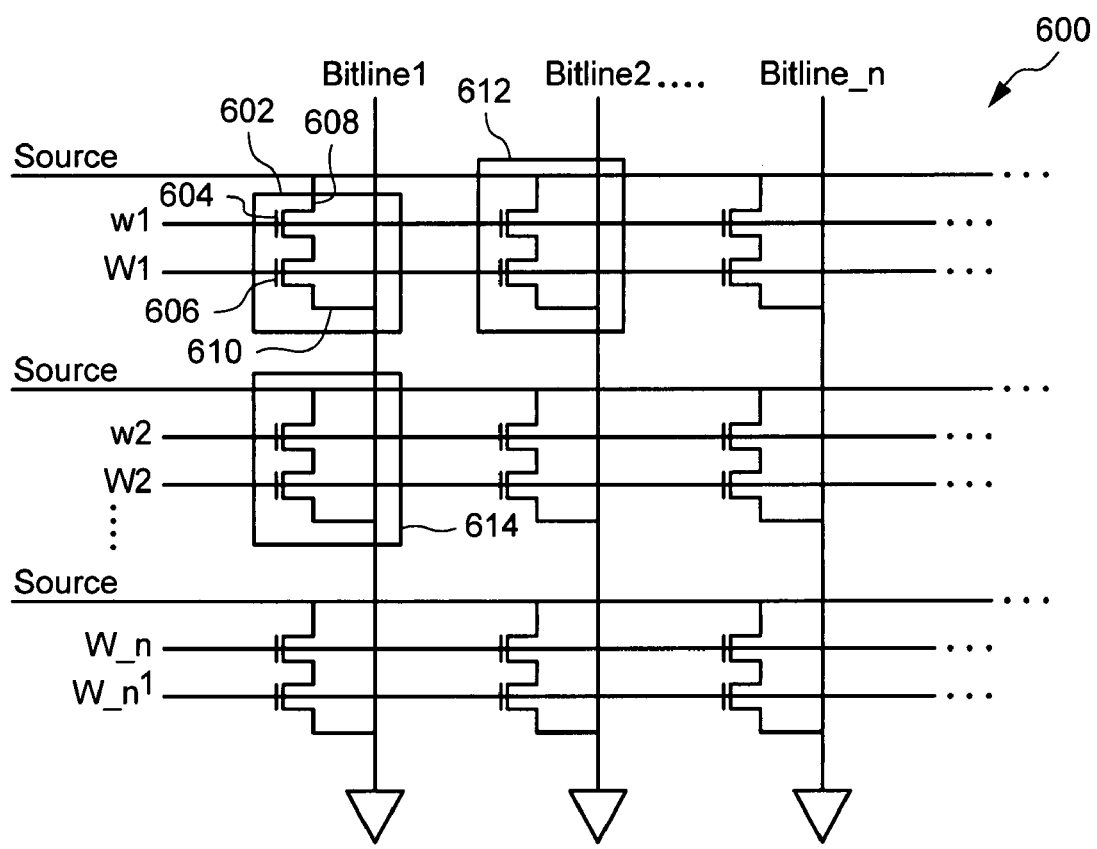
FIG. 6 is a schematic of a memory cell array according to an embodiment of the present invention.

FIG. 6 is a schematic of a memory cell array 600 according to an embodiment of the present invention. A CMOS non-volatile memory cell 602 in the memory cell array has a first gate 604 coupled to a first wordline W1 and a second gate 606 coupled to a second wordline W1'. The source 608 of the CMOS non-volatile memory cell 602 is coupled to a Source line, and the drain 610 of the CMOS non-volatile memory cell 602 is coupled to Bitline1. The CMOS non-volatile memory cell 602 is read by appropriately activating the word lines W1, W1' and Bitline 1, as discussed in reference to FIG. 2B, for example. A second CMOS non-volatile memory cell 612 in the same row as the first CMOS non-volatile memory cell 602 is concurrently read by activating Bitline2. A third CMOS non-volatile memory cell 614 in the same column as the first CMOS non-volatile memory cell 602 is concurrently read by activating its wordlines W2, W2'. Thus, the memory cell array 600 is read in a very similar fashion to reading MOSFET-based RAM memory cells commonly used in ICs.

FIG. 7 is a plan view of an FPGA 700 with a CMOS non-volatile memory block 720 according to an embodiment of the invention. The FPGA is an integrated circuit that includes CMOS portions in several of the functional blocks, such as in RAM and logic, and is fabricated using a CMOS fabrication process. The CMOS non-volatile memory block is incorporated in a configurable logic block, but could be incorporated in many of several functional blocks, such as an embedded memory area or any semiconductor area where security, identification verification, or other non-volatile functionality is desired, of the FPGA 700, or could be incorporated into the FPGA as a stand-alone memory block interconnected to the FPGA with a programmable interconnect element. The CMOS non-volatile memory block is desirable to include in an FPGA because it can store data provided by the manufacturer, such as device and/or lot identification and tracking, security features to prevent unauthorized or unintentional use of or access to selected portions of the FPGA (which could be defined by the manufacturer or by the user), and provide non-volatile set-up or configuration memory, for example.

The FPGA architecture includes a large number of different programmable tiles including multi-gigabit transceivers (MGTs 701), configurable logic blocks (CLBs 702), random access memory blocks (BRAMs 703), input/output blocks (IOBs 704), configuration and clocking logic (CONFIG/CLOCKS 705), digital signal processing blocks (DSPs 706), specialized input/output blocks (I/O 707) (e.g., configuration ports and clock ports), and other programmable logic 708 such as digital clock managers, analog-to-digital converters, system monitoring logic, and so forth. Some FPGAs also include dedicated processor blocks (PROC 710).

In some FPGAs, each programmable tile includes a programmable interconnect element (INT 711) having standardized connections to and from a corresponding interconnect element in each adjacent tile. Therefore, the programmable interconnect elements taken together implement the programmable interconnect structure for the illustrated FPGA. The programmable interconnect element (INT 711) also includes the connections to and from the programmable logic element within the same tile, as shown by the examples included at the top of FIG. 7.

For example, a CLB 702 can include a configurable logic element (CLE 712) that can be programmed to implement user logic plus a single programmable interconnect element (INT 711). A BRAM 503 can include a BRAM logic element (BRL 713) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 706 can include a DSP logic element (DSPL 714) in addition to an appropriate number of programmable interconnect elements. An IOB 704 can include, for example, two instances of an input/output logic element (IOL 715) in addition to one instance of the programmable interconnect element (INT 711). As will be clear to those of skill in the art, the actual I/O pads connected, for example, to the I/O logic element 715 are manufactured using metal layered above the various illustrated logic blocks, and typically are not confined to the area of the input/output logic element 715. In the pictured embodiment, a columnar area near the center of the die (shown crosshatched in FIG. 7) is used for configuration, clock, and other control logic.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, the processor block PROC 710 shown in FIG. 7 spans several columns of CLBs and BRAMs.

Note that FIG. 7 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 7 are purely exemplary. For example, in an actual FPGA more than one adjacent column of CLBs is typically included wherever the CLBs appear, to facilitate the efficient implementation of user logic.

While the present invention has been described in connection with specific embodiments, variations of these embodiments will be obvious to those of ordinary skill in the art. For example, different types of materials may be used in alternative embodiments, and a memory cell might have any one of several different layouts and/or different PROGRAM, READ, and ERASE configurations. Additionally, while the invention has been described with specific reference to PLDs and more particularly to PLDs having CMOS components, embodiments of the invention are desirable in other applications using non-volatile memory. Other modifications may be apparent, or might become apparent, to those of skill in the art. Therefore, the spirit and scope of the appended claims should not be limited to the foregoing description.

What is claimed is:

1. A method of programming a memory cell comprising:

applying a first voltage to a first gate disposed between a source and a drain of the memory cell;

flowing current from the source to the drain through a channel of the memory cell; and applying a second voltage greater than the first voltage to a second gate disposed between the source and the drain at so as to attract electrons flowing through the channel to a lateral programming structure disposed between the first gate and the second gate, after programming the memory cell:

electrically grounding a substrate and the source of the memory cell;

applying a voltage to the first gate, the second gate, and the drain of the memory cell;

and sensing a resistance of the memory cell between the source and the drain to read the memory cell.

2. The method of claim 1 wherein the source is grounded and a sufficiently high voltage is applied to the drain so as to create channel hot electrons.

3. The method of claim 2 wherein the sufficiently high voltage is about four volts, the first voltage is about two volts and the second voltage is about five volts.

4. The method of claim 1 wherein the electrons are attracted to the lateral programming structure so as to provide an accumulated negative charge on the lateral programming structure between the first gate and the second gate and not between the first gate and the channel or the second gate and the channel.

5. The method of claim 4 wherein the accumulated negative charge on the lateral programming structure accumulates positive charge in a channel region between the first gate and the second gate.

6. The method of claim 1 wherein the lateral programming layer comprises a planar layer extending from a major surface of a substrate of the memory cell and not extending beneath the first gate or the second gate.

7. The method of claim 1 wherein the lateral programming layer is closer to the drain than to the source.

8. The method of claim 1 wherein the voltage is a positive voltage.

9. The method of claim 8 wherein the voltage is $V_{DD}$.

* * * * *